United States Patent
Ota et al.

(10) Patent No.: US 9,503,132 B2
(45) Date of Patent: Nov. 22, 2016

(54) WIRELESS COMMUNICATION APPARATUS, COMMUNICATION CONTROL METHOD, AND COMPUTER-READABLE RECORDING MEDIUM

(71) Applicant: FUJITSU LIMITED, Kawasaki-shi, Kanagawa (JP)

(72) Inventors: Mutsuhito Ota, Sapporo (JP); Setsuya Nagaya, Sapporo (JP);
(Continued)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/811,893

(22) Filed: Jul. 29, 2015

(65) Prior Publication Data
US 2016/0080010 A1 Mar. 17, 2016

(30) Foreign Application Priority Data
Sep. 12, 2014 (JP) ................................. 2014-186721

(51) Int. Cl.
*H04B 1/04* (2006.01)
*H04B 1/00* (2006.01)
(Continued)

(52) U.S. Cl.
CPC .......... *H04B 1/0475* (2013.01); *H04B 1/0053* (2013.01); *H04B 17/101* (2015.01);
(Continued)

(58) Field of Classification Search
CPC .................................................. H04B 1/0475
(Continued)

(56) References Cited

U.S. PATENT DOCUMENTS

| 6,731,915 B1 * | 5/2004 | Tran ...................... H03F 1/3247 330/144 |
| 9,143,098 B2 * | 9/2015 | Qin .......................... H03F 3/21 |
| 2012/0120990 A1 | 5/2012 | Koren et al. |

FOREIGN PATENT DOCUMENTS

| EP | 2704318 A1 | 3/2014 |
| EP | 2961082 | 12/2015 |

(Continued)

OTHER PUBLICATIONS

EESR—The Extended European Search Report issued on Feb. 5, 2016 for European Patent Application No. 15177767.9.
(Continued)

*Primary Examiner* — Sanh Phu
(74) *Attorney, Agent, or Firm* — Fujitsu Patent Center

(57) ABSTRACT

A wireless communication apparatus includes an amplifying unit that amplifies an input signal that includes signals with different frequencies of a first frequency and the second frequency; a measuring unit that measures a level of inter modulation distortion generated in a signal obtained by the input signal being amplified by the amplifying unit; a determining unit that determines whether the level of the inter modulation distortion measured by the measuring unit is equal to or greater than a regulation value that is previously stored; and a control unit that decreases, when a result of the determination obtained by the determining unit indicates that the level of the inter modulation distortion is equal to or greater than the regulation value, a level of a signal input to the amplifying unit.

9 Claims, 13 Drawing Sheets

(72) Inventors: Shinichi Kawai, Sendai (JP); Yusuke Yamamori, Sapporo (JP)

(51) Int. Cl.
*H04B 17/10* (2015.01)
*H04L 27/26* (2006.01)

(52) U.S. Cl.
CPC .............. *H04B 2001/0416* (2013.01); *H04B 2001/0425* (2013.01); *H04L 27/2614* (2013.01)

(58) Field of Classification Search
USPC ...................................................... 455/114.3
See application file for complete search history.

(56) References Cited

FOREIGN PATENT DOCUMENTS

| | | |
|---|---|---|
| JP | 08-213919 | 8/1996 |
| JP | 2009-278225 | 11/2009 |
| JP | 2010-11062 | 1/2010 |
| WO | 2014/129038 A1 | 8/2014 |

OTHER PUBLICATIONS

3GPP TR 36.912 v11.0.0 (Sep. 2012), 3rd Generation Partnership Project, Technical Specification Group Radio Access Network; Feasibility study for Further Advancements for E-UTRA (LTE-Advanced) (Release 11). (62 pages).

* cited by examiner

FIG.7
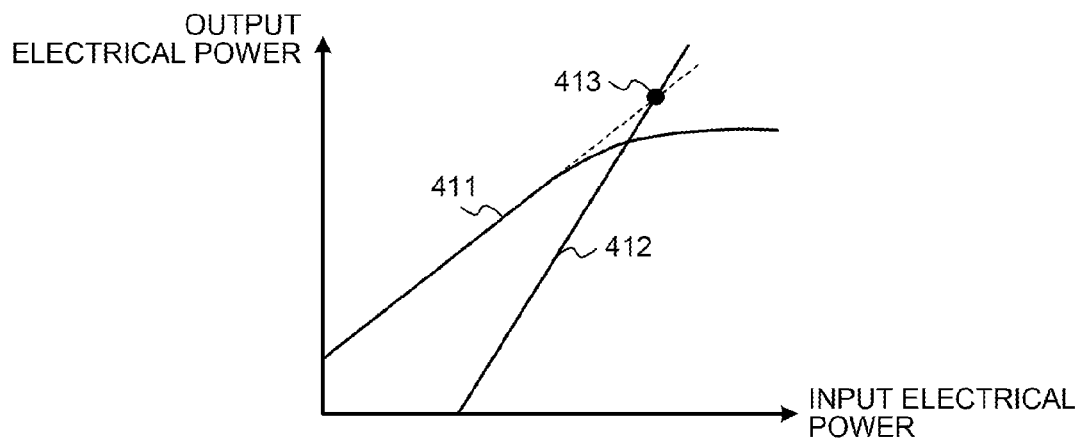
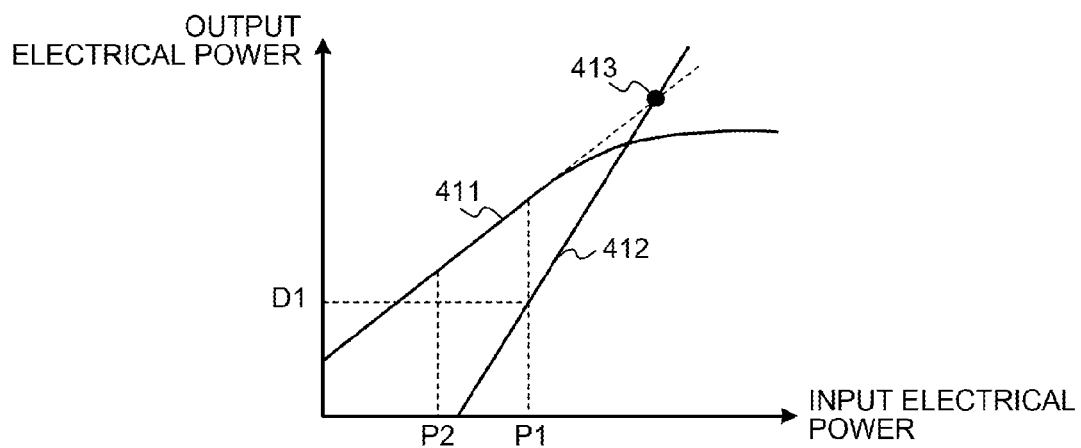
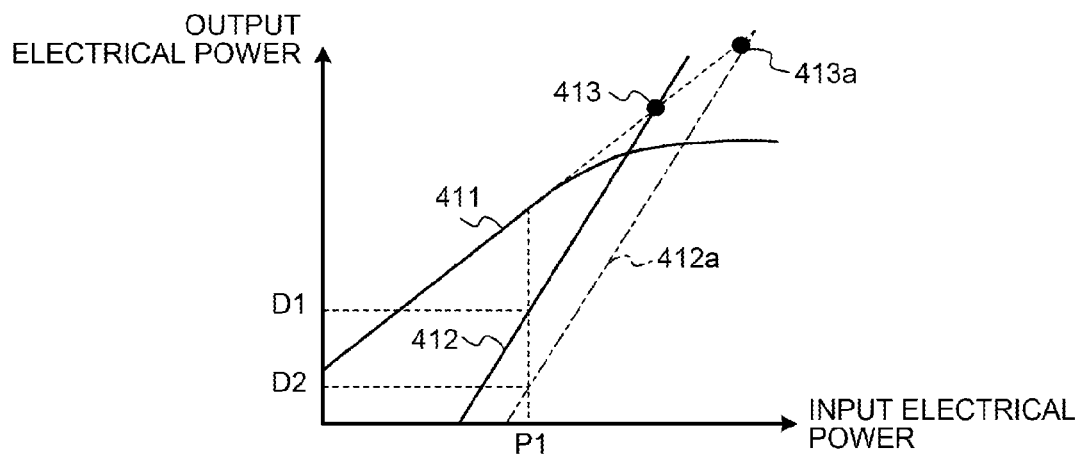

WIRELESS COMMUNICATION APPARATUS, COMMUNICATION CONTROL METHOD, AND COMPUTER-READABLE RECORDING MEDIUM

CROSS-REFERENCE TO RELATED APPLICATION

This application is based upon and claims the benefit of priority of the prior Japanese Patent Application No. 2014-186721, filed on Sep. 12, 2014, the entire contents of which are incorporated herein by reference.

FIELD

The embodiments discussed herein are directed to a wireless communication apparatus, a communication control method, and a computer-readable recording medium.

BACKGROUND

In recent years, as high-speed data communication and wider bandwidth of communication frequency are desired, in the future, implementation of the Long Term Evolution (LTE) technology using carrier aggregation (CA) is expected. The CA is a method of performing communication by simultaneously using a plurality of carriers called component carriers (CCs). Namely, for example, as illustrated in FIG. 13, communication is simultaneously performed by using a plurality of CCs 11 to 13 each of which has a different frequency.

In FIG. 13, for example, if the CC 11 belongs to a different frequency band to which the CCs 12 and 13 belong, communication is performed by using non-contiguous CCs belonging to different frequency bands. Consequently, in this case, different transmission circuits are provided for at least each frequency band and then amplification or the like is performed by a power amplifier in each of the transmission circuits. In contrast, for example, if the CC 11 and the CCs 12 and 13 belong to the same frequency band, communication is performed by using contiguous or non-contiguous CCs belonging to the same frequency band. In this case, by using a power amplifier common to all of the CCs, it is possible to share a transmission circuit and suppress an increase in the size of a device or the cost.

Patent Document 1: Japanese Laid-open Patent Publication No. 08-213919
Patent Document 2: Japanese Laid-open Patent Publication No. 2009-278225
Patent Document 3: Japanese Laid-open Patent Publication No. 2010-11062
Non-Patent Document 1: 3GPP ($3^{rd}$ Generation Partnership Project), "Feasibility study for Further Advancements for E-UTRA (LTE-Advanced) (Release 11)", 3GPP TR36.912 v11.0.0, September, 2012

However, if signals of a plurality of CCs are amplified by a single power amplifier, there is a problem in that inter modulation distortion according to the distortion characteristic of the power amplifier is generated. The inter modulation distortion becomes a spurious component of the signal emitted from an antenna and gives an interference with communication performed in a frequency band in which the CCs belong or performed in an adjacent frequency band.

FIG. 14 is a schematic diagram illustrating frequencies of inter modulation distortion generated when signals of two CCs with different frequencies are amplified by a single power amplifier. In FIG. 14, if signals of a CC 1 with a frequency of f0 and a CC2 with a frequency of f1 are amplified by a single power amplifier, in a frequency domain in the vicinity of these CCs, inter modulation distortion is generated in a difference frequency that is an integral multiple of the wave of the frequency of each CC. Namely, for example, in the frequencies (2f1-f0) and (2f0-f1), third-order inter modulation distortions IM3+ and IM3− are generated and, in the frequencies (3f1-2f0) and (3f0-2f1), fifth-order inter modulation distortions IM+5 and IM−5 are generated.

In order to suppress these inter modulation distortions, it is conceivable to increase the power supply voltage supplied to a power amplifier and raise the saturation level of the power amplifier. However, when this countermeasure is taken, electrical power consumption of the power amplifier is increased and thus resulting in an increase in electrical power consumption of the entirety of a wireless communication apparatus.

Furthermore, similar to a case of using CCs with different frequency bands, it is also conceivable to provide a power amplifier for each CC and allow a signal of each CC to be amplified by another power amplifier. However, when this countermeasure is taken, a plurality of power amplifiers is provided in a wireless communication apparatus and thus resulting in an increase in size of a device or the cost.

SUMMARY

According to an aspect of an embodiment, a wireless communication apparatus includes an amplifying unit that amplifies an input signal that includes signals with different frequencies of a first frequency and the second frequency; a measuring unit that measures a level of inter modulation distortion generated in a signal obtained by the input signal being amplified by the amplifying unit; a determining unit that determines whether the level of the inter modulation distortion measured by the measuring unit is equal to or greater than a regulation value that is previously stored; and a control unit that decreases, when a result of the determination obtained by the determining unit indicates that the level of the inter modulation distortion is equal to or greater than the regulation value, a level of a signal input to the amplifying unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a schematic diagram illustrating specific examples of the input/output characteristics of a power amplifier according to the first embodiment;

DESCRIPTION OF EMBODIMENTS

Preferred embodiments of the present invention will be explained with reference to accompanying drawings. The present invention is not limited to the embodiments.

[a] First Embodiment

Figure 1:
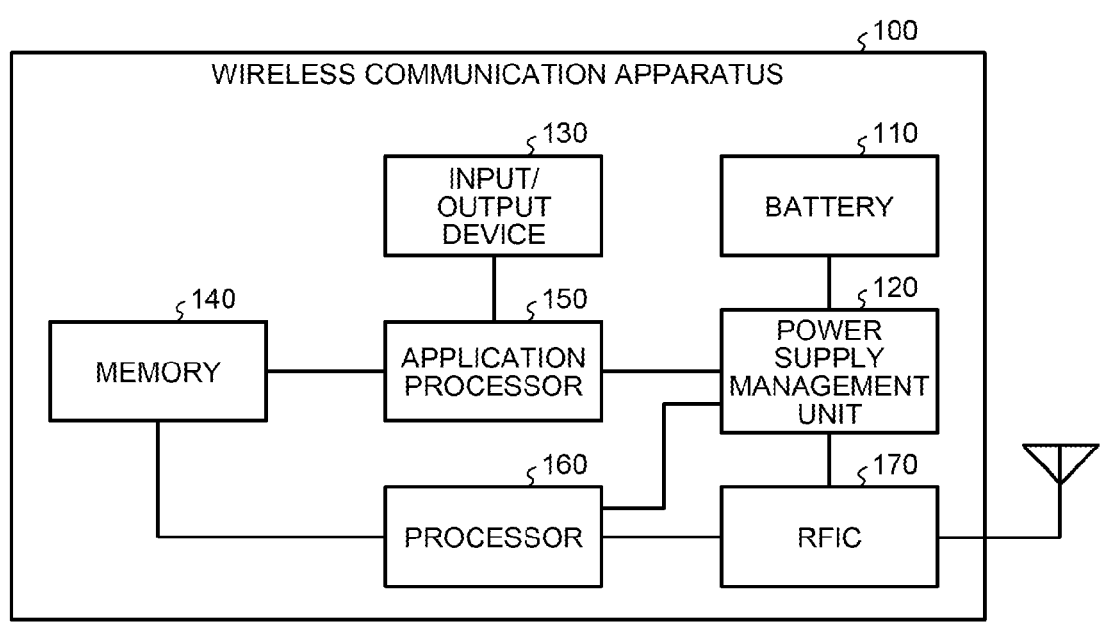
FIG. 1 is a block diagram illustrating the configuration of a wireless communication apparatus according to a first embodiment.

FIG. 1 is a block diagram illustrating the configuration of a wireless communication apparatus according to a first embodiment. A wireless communication apparatus 100 illustrated in FIG. 1 includes a battery 110, a power supply management unit 120, an input/output device 130, a memory 140, an application processor 150, a processor 160, and a radio frequency integrated circuit (RFIC) 170.

The battery 110 is a power supply that supplies electrical power to each unit in the wireless communication apparatus 100. Each of the units in the wireless communication apparatus 100 is operated by electrical power supplied by the battery 110.

The power supply management unit 120 controls a supply of electrical power supplied from the battery 110 to each of the units in the wireless communication apparatus 100. Specifically, the power supply management unit 120 controls electrical power supplied to, for example, the application processor 150, the processor 160, and the RFIC 170.

The input/output device 130 includes, for example, a touch panel, a display, a key, a speaker, and the like; receives an operation performed by a user; and outputs information to the user.

The memory 140 includes, for example, a random access memory (RAM) or the like, and stores therein data that is used for processes performed by the application processor 150 and the processor 160. Specifically, the memory 140 stores therein, for example, data that is used when the application processor 150 executes an application.

The application processor 150 includes, for example, a central processing unit (CPU) or the like, and executes various applications by using the memory 140. At this time, the application processor 150 executes a process in accordance with an operation performed by a user received by the input/output device 130 and then outputs, to the input/output device 130, information that is obtained as the result of the process.

The processor 160 includes, for example, a CPU or the like, and controls, by using the memory 140, processes performed in the entire wireless communication apparatus 100. Specifically, the processor 160 generates, for example, a transmission signal with a baseband frequency, performs error correction coding on the transmission signal, and transmits the signal from the RFIC 170. Furthermore, when the processor 160 transmits a signal by using carrier aggregation (CA), the processor 160 notifies the RFIC 170 of frequency information on a component carrier (CC) that is used for the CA.

The RFIC 170 converts the frequency of data between a baseband frequency and a radio frequency; transmits a transmission signal with a radio frequency via an antenna; and converts a frequency of reception data received via the antenna to the baseband frequency. Furthermore, when the RFIC 170 transmits a signal by using CA, the RFIC 170 determines whether the level of inter modulation distortion generated in a power amplifier is less than a predetermined regulation value. If the level of the inter modulation distortion is equal to or greater than the predetermined regulation value, the RFIC 170 decreases electrical power of a transmission signal to an allowable range. Furthermore, if the level of the inter modulation distortion is equal to or greater than the predetermined regulation value even when the RFIC 170 decreases the electrical power of the transmission signal, the RFIC 170 instructs the power supply management unit 120 to increase the voltage applied to the power amplifier. The configuration and the operation of the RFIC 170 will be described in detail later.

Figure 2:
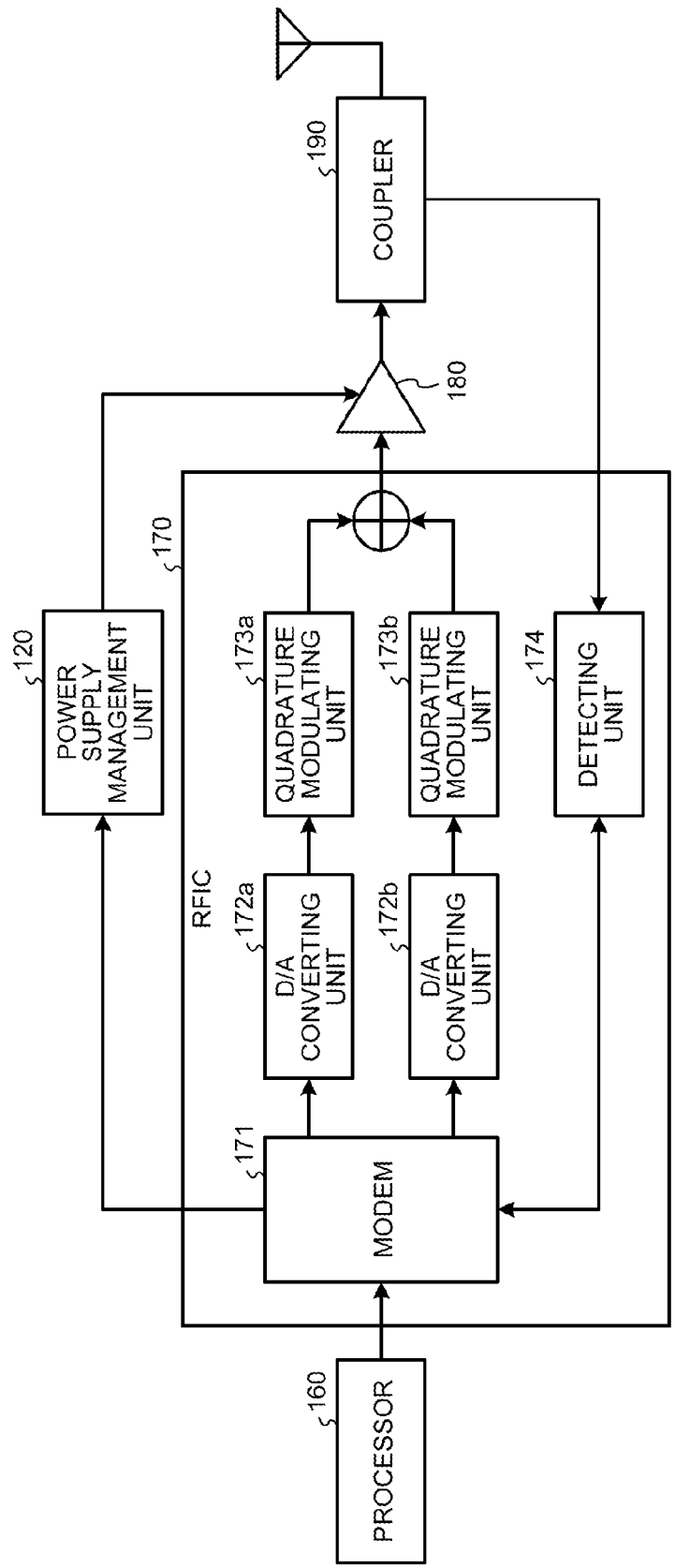
FIG. 2 is a block diagram illustrating the configuration of a transmitting unit according to the first embodiment.

FIG. 2 is a block diagram illustrating the configuration of a transmitting unit related to data transmission performed by the wireless communication apparatus 100 according to the first embodiment. In FIG. 2, the configuration related to data reception is omitted. As illustrated in FIG. 2, a power amplifier 180 and a coupler 190 are provided between the RFIC 170 and the antenna. Furthermore, the RFIC 170 includes a modem 171, digital/analogue (D/A) converting units 172a and 172b, quadrature modulating units 173a and 173b, and a detecting unit 174. Furthermore, the power amplifier 180 is an example of an amplifying unit.

The modem 171 modulates transmission signals output from the processor 160 and outputs transmission signals in accordance with frequencies of a plurality of CCs. In FIG. 2, because transmission signals are transmitted by using two CCs, the modem 171 outputs the transmission signals associated with the respective CCs to the D/A converting units 172a and 172b. Furthermore, the modem 171 determines whether the level of inter modulation distortion generated in the power amplifier 180 is equal to or greater than the predetermined regulation value. If the level is equal to or greater than the predetermined regulation value, the modem 171 decreases the electrical power of the transmission signals. Furthermore, if the level of the inter modulation distortion is still equal to or greater than the predetermined regulation value even when the modem 171 decreases the electrical power of the transmission signals, the modem 171 instructs the power supply management unit 120 to increase the voltage applied to the power amplifier 180. Furthermore, the function of the modem 171 will be described in detail with reference to FIG. 3 later. Furthermore, instead of determining whether the level of inter modulation distortion is equal to or greater than the regulation value, the modem 171 may also, of course, determine the level is less than the regulation value.

The D/A converting units 172a and 172b convert digital transmission signals to analog signals that are output from the modem 171.

The quadrature modulating units 173a and 173b perform quadrature modulation on the analog signals output from the respective D/A converting units 172a and 172b and obtain transmission signals with a radio frequency. The transmission signals output from the respective quadrature modulating units 173a and 173b have different frequencies of CCs and are output to the power amplifier 180 after these transmission signals are combined.

The detecting unit 174 measures the level of inter modulation distortion included in the transmission signal amplified by the power amplifier 180. Then, the detecting unit 174 notifies the modem 171 of the measurement result of the level of the inter modulation distortion. The configuration of the detecting unit 174 will be described in detail with reference to FIG. 4 later.

The power amplifier 180 is operated by the voltage applied from the power supply management unit 120 and amplifies the transmission signals output from the RFIC 170. If electrical power of input transmission signals is relatively small, the power amplifier 180 linearly amplifies the input signals, whereas, if electrical power of input transmission signals becomes relatively great, the power amplifier 180 non-linearly amplifies the input signals. Consequently, as the electrical power of the input transmission signals is increased, the power amplifier 180 generates greater inter modulation distortion.

The coupler 190 splits the transmission signals amplified by the power amplifier 180, transmits one of the signals obtained by the splitting from the antenna, and feeds back the other one of the signals to the detecting unit 174 in the RFIC 170.

Figure 3:
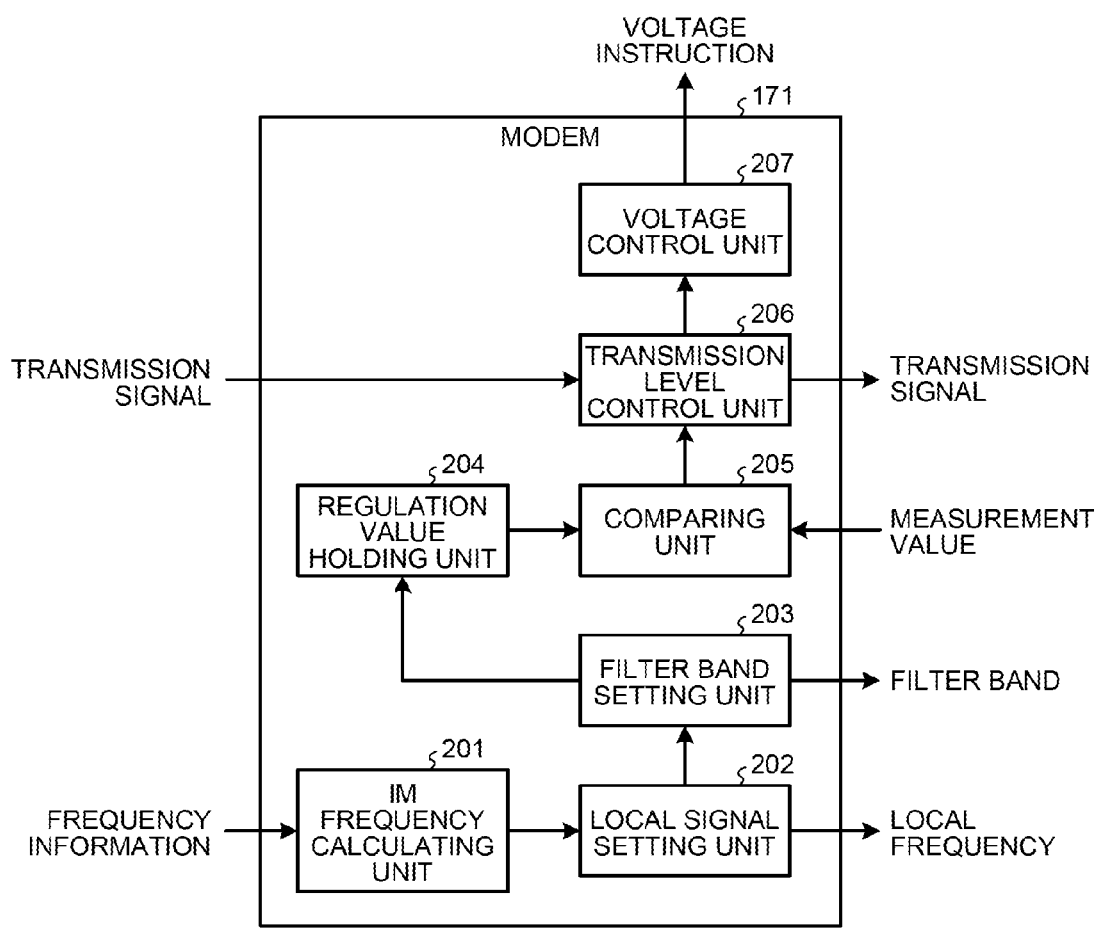
FIG. 3 is a block diagram illustrating the function of a modem according to the first embodiment.

FIG. 3 is a block diagram illustrating the function of the modem 171 according to the first embodiment. As illustrated in FIG. 3, the modem 171 includes an inter modulation distortion frequency calculating unit (hereinafter, simply referred to as an "IM frequency calculating unit") 201, a local signal setting unit 202, a filter band setting unit 203, a regulation value holding unit 204, a comparing unit 205, a transmission level control unit 206, and a voltage control unit 207. The comparing unit 205 is an example of a determining unit and the transmission level control unit 206 is an example of a control unit.

The IM frequency calculating unit 201 acquires, from the processor 160, frequency information related to frequencies of a plurality of CCs in which transmission signals are superimposed and calculates, on the basis of the acquired frequency information, a frequency of inter modulation distortion that is generated in the power amplifier 180. Namely, because the inter modulation distortion in the vicinity of the frequencies of the CCs is generated in a difference frequency that is an integral multiple of the frequencies of these CCs, the IM frequency calculating unit 201 calculates a frequency of the inter modulation distortion by calculating a difference by performing integer multiplications of the frequency of each of the CCs. At this time, it is sufficient for the IM frequency calculating unit 201 to calculate a frequency of the inter modulation distortion having a frequency in the vicinity of the CC, for example, calculate a frequency of the third-order, the fifth-order, and the seventh-order inter modulation distortion.

The local signal setting unit 202 notifies the detecting unit 174 of a local frequency that is associated with the frequency of the inter modulation distortion calculated by the IM frequency calculating unit 201. Namely, the local signal setting unit 202 notifies the detecting unit 174 of a local frequency that is used to extract inter modulation distortion from a signal that is fed back from the coupler 190.

The filter band setting unit 203 acquires the frequency of the inter modulation distortion from the local signal setting unit 202 and sequentially notifies the detecting unit 174 of a filter bandwidth that is used to pass each of the frequency components of the inter modulation distortion. Namely, the filter band setting unit 203 notifies, first, the detecting unit 174 of a filter bandwidth that is used to pass a frequency component of, for example, the third-order modulation; notifies, then, the detecting unit 174 of a filter bandwidth that is used to pass a frequency component of the fifth-order modulation distortion; and, then, notifies the detecting unit 174 of a filter bandwidth that is used to pass a frequency component of the seventh-order modulation distortion.

The regulation value holding unit 204 holds a regulation value of the level of inter modulation distortion for each communication system and frequency band. If a filter bandwidth is set in the filter band setting unit 203, the regulation value holding unit 204 outputs a regulation value that is associated with the set filter bandwidth to the comparing unit 205. Namely, if a filter bandwidth that is used to pass a frequency component of, for example, the third-order modulation distortion, the regulation value holding unit 204 outputs, to the comparing unit 205, the regulation value of the frequency band that includes the frequency of the third-order modulation distortion.

Figure 4:
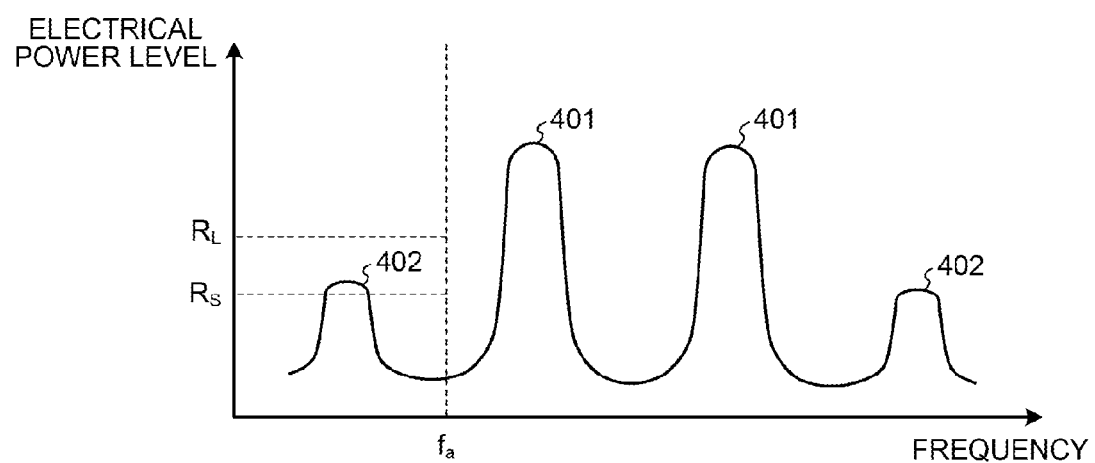
FIG. 4 is a schematic diagram illustrating a specific example of a regulation value according to the first embodiment.

There are two types of regulation values of the inter modulation distortion: a public regulation value determined by law, an ordinance, or the like and a voluntary regulation value voluntarily determined by a telecommunications carrier or the like. FIG. 4 is a schematic diagram illustrating a specific example of the relationship between a public regulation value and a voluntary regulation value.

In FIG. 4, inter modulation distortion generated in a communication system that uses frequency bands of frequencies equal to or greater than a frequency $f_a$ appears in a frequency band with frequencies less than the frequency $f_a$ that is used by another communication system. Namely, if signals are transmitted by using two CCs 401 with the frequency of $f_a$ or more, between third-order modulation distortions 402 generated due to these CCs 401, the frequency on the lower side of the third-order modulation distortion 402 is less than the frequency $f_a$. Furthermore, regarding the communication system that uses the frequency band with a frequency less than the frequency $f_a$ a public regulation value $R_L$ is set and a voluntary regulation value $R_S$ is set by a telecommunications carrier. As illustrated in FIG. 4, normally, the voluntary regulation value $R_S$ is smaller than the public regulation value $R_L$ and a strict regulation is imposed. The regulation value holding unit 204 may also hold both the public regulation value $R_L$ and the voluntary regulation value $R_S$ or may also one of these regulation values that imposes more strict regulation.

A description will be given here by referring back to FIG. 3. The comparing unit 205 compares a regulation value output from the regulation value holding unit 204 with a measurement value of the level of a frequency component output from the detecting unit 174. Then, the comparing unit 205 notifies the transmission level control unit 206 of the comparison result indicating whether the measurement value is less than the regulation value. At this point, if the measurement value is less than the regulation value, this indicates that the level of the inter modulation distortion satisfies the regulation, whereas, if the measurement value is equal to or greater than the regulation value, this indicates that the level of the inter modulation distortion does not satisfy the regulation.

If the result of comparison obtained by the comparing unit 205 indicates that the level of the inter modulation distortion does not satisfy the regulation, the transmission level control unit 206 calculates, on the basis of a difference between the regulation value and the measurement value of the level of the inter modulation distortion, the upper limit of the transmission level that is to be used to satisfy the regulation. Then, the transmission level control unit 206 controls electrical power of a transmission signal so as not to exceed the upper limit of the calculated transmission level. Namely, the transmission level control unit 206 adjusts the transmission level such that the measurement value of the level of the inter modulation distortion does not exceed the regulation value and decreases the electrical power of the transmission signal that is input to the power amplifier 180.

At this time, the transmission level control unit 206 may also equally decrease the electrical power of transmission signals associated with a plurality of CCs or, alternatively, may also perform weighting on the CCs in accordance with the frequency components in each of which the measurement value exceeds the regulation value and may also decrease, with priority, the electrical power of a transmission signal that is associated with one of the CCs. Namely, for example, as illustrated in FIG. 4, if the level of the third-order modulation distortion 402 on the lower side exceeds the regulation value, the transmission level control unit 206 may also decrease, with priority, the electrical power of the transmission signal that is associated with one of the CCs 401 in which the contribution to the third-order modulation distortion 402 on the lower side is high. By doing so, the inter modulation distortion can be efficiently suppressed.

Specifically, in FIG. 4, if the frequencies of these two CCs 401 are assumed to be f0 and f1 (f0<f1), respectively, the frequency on the lower side of the third-order modulation distortion 402 is (2f0-f1) and the frequency on the upper side of the third-order modulation distortion 402 is (2f1-f0). Consequently, the level of the third-order modulation distortion 402 on the lower side varies by 2 dB if the level of the CC 401 of the frequency f0 is changed by, for example, 1 dB. In contrast, the level of the third-order modulation distortion 402 on the lower side varies by 1 dB if the level of the CC 401 of the frequency f1 is changed by, for example, 1 dB. In this way, for the third-order modulation distortion 402 on the lower side, because the contribution of the CC 401 with the low frequency f0 is high, the transmission level control unit 206 may also decrease, with priority, the electrical power of the transmission signal associated with this CC 401.

More specifically, a description will be given with the assumption of a case in which a difference between the regulation value and the measurement value of the level of the third-order modulation distortion 402 on the lower side is, for example, 6 dB. In this case, by decreasing the level of each of the signals of the two CCs 401 by 2 dB, the transmission level control unit 206 can decrease the level of the inter modulation distortion by 6 dB (=2×2 dB+2 dB). However, if the level of each of the signals of the CCs 401 is equally decreased, the level of the entirety of the transmission signal is decreased by a factor of about 0.63. In contrast, by decreasing, by 3 dB, the level of the signal of the CC 401 that has the frequency f0 and in which contribution to the third-order modulation distortion 402 on the lower side is high, the transmission level control unit 206 may also decrease the level of the inter modulation distortion by 6 dB (=2×3 dB+0 dB). As described above, when decreasing the level of the signal of the CC in which contribution to the third-order modulation distortion on the lower side is high, the level of the entirety of the transmission signal is only decreased by a factor of about 0.75.

At this time, transmission electrical power may sometimes be specified, from a base station device, by transmission electrical power control that is performed by the base station device that is the counterpart of communication of, for example, the wireless communication apparatus 100. Consequently, the transmission level control unit 206 sets the upper limit of the transmission level within the range that can be allowed by the transmission electrical power control and then controls the electrical power of the transmission signals. Accordingly, if the upper limit of the transmission level calculated from a difference between the regulation value and the measurement value exceeds the range allowed by the transmission electrical power control, the transmission level control unit 206 sets a limit value allowed by the transmission electrical power control as the upper limit of the transmission level. Then, the transmission level control unit 206 notifies the voltage control unit 207 that inter modulation distortion is not sufficiently suppressed if the electrical power of the transmission signals is only decreased.

If the voltage control unit 207 is notified by the transmission level control unit 206 indicating that a decrease in the transmission level does not sufficiently suppress the inter modulation distortion, the voltage control unit 207 instructs the power supply management unit 120 to increase the voltage applied to the power amplifier 180. At this time, the voltage control unit 207 instructs to increase the voltage applied to the power amplifier 180 by, for example, a predetermined step width. Furthermore, if the result of comparison performed by the comparing unit 205 indicates that the level of the inter modulation distortion satisfies the regulation, the voltage control unit 207 may also instruct to decrease the voltage applied to the power amplifier 180 within the range in which the regulation is satisfied. By doing so, electrical power consumed in the wireless communication apparatus 100 can be reduced.

Figure 5:
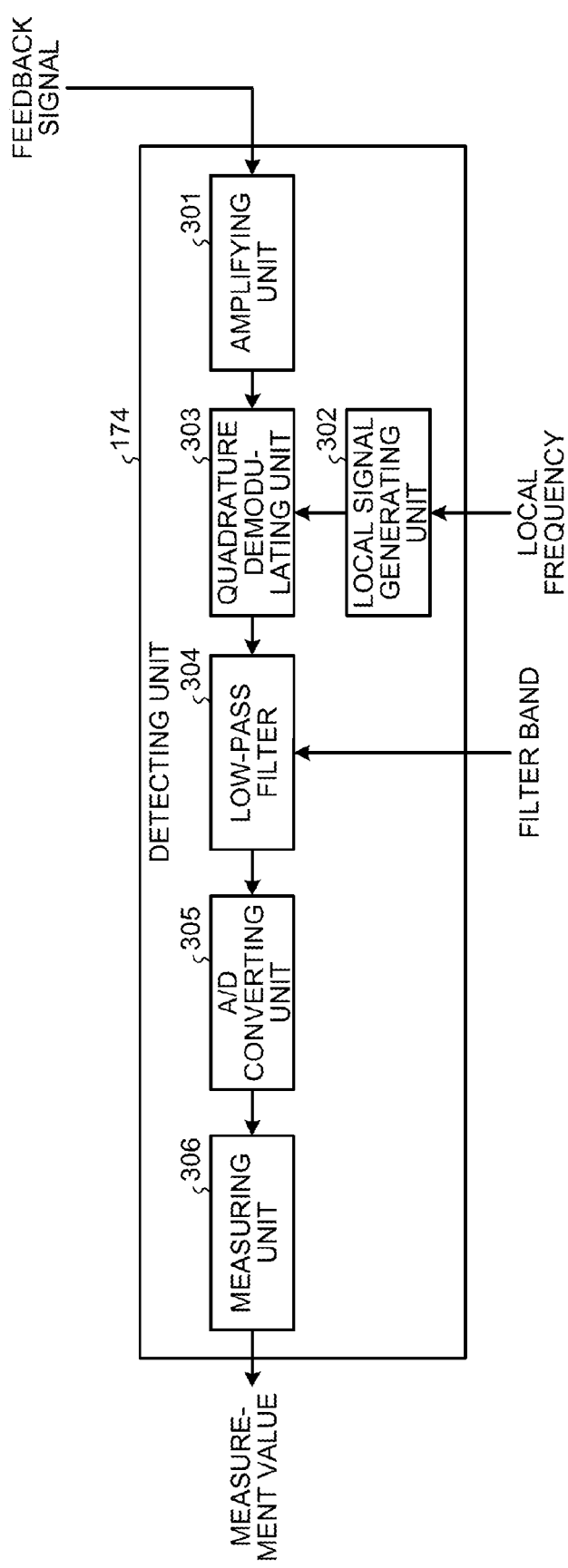
FIG. 5 is a block diagram illustrating the configuration of a detecting unit according to the first embodiment.

FIG. 5 is a block diagram illustrating the configuration of the detecting unit 174 according to the first embodiment. As illustrated in FIG. 5, the detecting unit 174 includes an amplifying unit 301, a local signal generating unit 302, a quadrature demodulating unit 303, a low-pass filter 304, an analogue/digital (A/D) converting unit 305, and a measuring unit 306.

The amplifying unit 301 amplifies a feedback signal that is obtained from the transmission signals branched by the coupler 190.

The local signal generating unit 302 generates a local signal that has a local frequency and that is notified from the local signal setting unit 202 in the modem 171 and then outputs the local signal to the quadrature demodulating unit 303. Namely, the local signal generating unit 302 generates, from a feedback signal, a local signal that is used to extract inter modulation distortion and then outputs the local signal to the quadrature demodulating unit 303.

By using the local signal that is output from the local signal generating unit 302, the quadrature demodulating unit 303 performs quadrature demodulation on the feedback signal output from the amplifying unit 301. Because the quadrature demodulating unit 303 performs the quadrature demodulation by using the local signal that is used to extract the inter modulation distortion, the quadrature demodulating unit 303 outputs inter modulation distortion in which a CC component is removed from the feedback signal.

The low-pass filter 304 sequentially sets the filter bandwidths notified from the filter band setting unit 203 in the modem 171 and outputs, from among the inter modulation distortions, frequency components with the set filter bandwidths. Namely, the low-pass filter 304 outputs, first, for example, a frequency component of the third-order modulation distortion; then outputs a frequency component of the fifth-order modulation distortion; and then outputs a frequency component of the seventh-order modulation distortion.

The A/D converting unit 305 converts the frequency component output from the low-pass filter 304 to a digital signal. Namely, the A/D converting unit 305 sequentially converts frequency components associated with, for example, the third-order, the fifth-order, and the seventh-order inter modulation distortion to digital signals.

The measuring unit 306 measures the level of digital signals output from the A/D converting unit 305. Namely, the measuring unit 306 sequentially measures the level of the frequency components associated with, for example, the third-order, the fifth-order, and the seventh-order inter modulation distortions. Then, the measuring unit 306 outputs the measurement value of the level of each of the frequency components to the comparing unit 205 in the modem 171.

Figure 6:
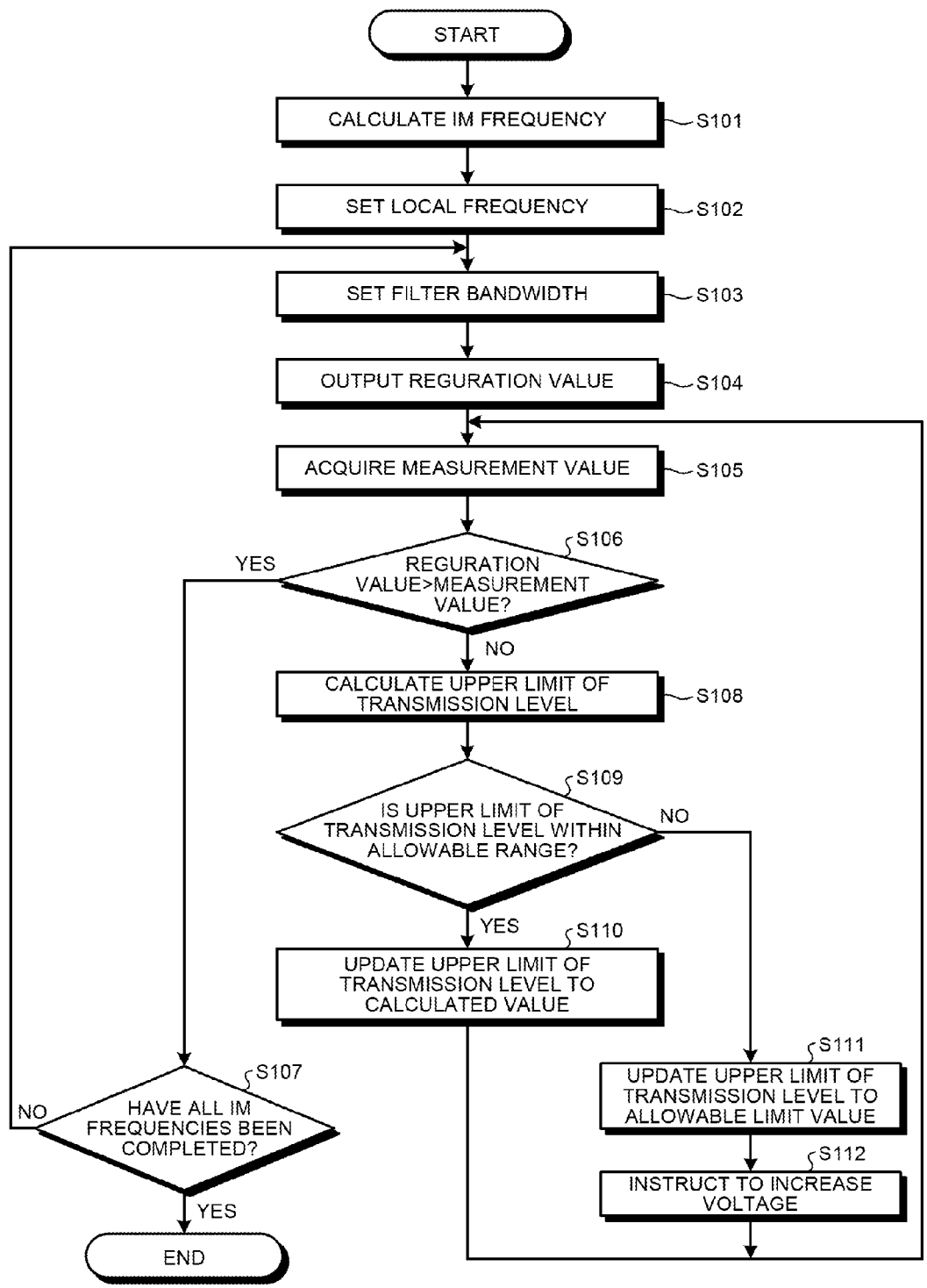
FIG. 6 is a flowchart illustrating a distortion suppressing process according to the first embodiment.

In the following, the distortion suppressing process performed by the wireless communication apparatus 100 having the configuration described above will be described with reference to the flowchart illustrated in FIG. 6.

If frequency information on a plurality of CCs in which transmission signals are superimposed is input from the processor 160 to the IM frequency calculating unit 201, the IM frequency calculating unit 201 calculates a frequency of the inter modulation distortion generated in the power amplifier 180 (Step S101). Namely, a difference frequency that is an integral multiple of the frequency of each CC is calculated as the frequency of the inter modulation distortion. Specifically, for example, if frequencies of two CCs are f0 and f1 and if transmission signals obtained from these two CCs being superimposed are combined and input to the power amplifier 180, the third-order inter modulation distortion is generated in the frequencies (2f1-f0) and (2f0-f1). Furthermore, the fifth-order inter modulation distortion is generated in the frequencies (3f1-2f0) and (3f0-2f1).

The frequencies of the inter modulation distortion calculated in this way are notified to the local signal setting unit 202 and a local frequency in the local signal setting unit 202 is set by the detecting unit 174 (Step S102). Namely, the local signal setting unit 202 notifies the local signal generating unit 302 in the detecting unit 174 of the local frequency that is used to remove CC components from the signals amplified by the power amplifier 180 and extract inter modulation distortion. At this time, because the level of the inter modulation distortion in the vicinity of the frequency of the CC is high, local frequencies that are used to extract the inter modulation distortion appearing in the vicinity of the frequency of CCs are notified to the local signal generating unit 302. Specifically, the local frequencies that are used to extract the frequency components associated with, for example, the third-order, the fifth-order, and the seventh-order inter modulation distortion are notified to the local signal generating unit 302.

Then, the local signal generating unit 302 generates a local signal with the notified local frequency and outputs the signal to the quadrature demodulating unit 303. Consequently, after the feedback signal that is fed back from the coupler 190 is amplified by the amplifying unit 301 and is subjected to quadrature demodulation by the quadrature demodulating unit 303, the inter modulation distortion included in the feedback signal is output to the low-pass filter 304.

At the same time at which the local frequency that is used to extract the inter modulation distortion is set, the filter band setting unit 203 sets a filter bandwidth such that a specific frequency component of the inter modulation distortion passes the low-pass filter 304 (Step S103). Specifically, a filter bandwidth is set such that a frequency component associated with, for example, the third-order modulation distortion passes the low-pass filter 304. With this setting, the low-pass filter 304 outputs, to the A/D converting unit 305, the frequency component that is associated with the third-order modulation distortion from among the inter modulation distortions included in the feedback signal.

If the filter bandwidth of the low-pass filter 304 is set by the filter band setting unit 203, the regulation value that is associated with the set filter bandwidth is output from the regulation value holding unit 204 to the comparing unit 205 (Step S104). Specifically, if the frequency component associated with, for example, the third-order modulation distortion is set to pass the low-pass filter 304, the regulation value in the frequency band belonging to this frequency component is output to the comparing unit 205 by the regulation value holding unit 204.

Then, the measuring unit 306 in the detecting unit 174 measures the level of the frequency component that is output from the low-pass filter 304 and that is subjected to A/D conversion by the A/D converting unit 305 (Step S105). At this point, the level of the frequency component associated with, for example, the third-order modulation distortion is measured and the obtained measurement value is output to the comparing unit 205 in the modem 171.

Then, the comparing unit 205 compares, as magnitude comparison, the regulation value with the measurement value of the level of the frequency component (Step S106). If the result of this comparison indicates that the measurement value is less than the regulation value (Yes at Step S106), this result indicates that the level of the frequency component associated with, for example, the third-order modulation distortion is smaller than the regulation value and indicates that the regulation is satisfied. Accordingly, the filter band setting unit 203 determines whether, for all of the frequency components included in the inter modulation distortion extracted from the feedback signal, the comparison with the regulation value has been completed (Step S107). If the result of this determination indicates that the comparison has been completed for all of the frequency components (Yes at Step S107), the distortion suppressing process has been completed. In contrast, if some frequency components that have not yet been compared with the regulation value are present (No at Step S107), the filter bandwidth of the low-pass filter 304 is set so as to pass one of these frequency components is to be passed (Step S103). Namely, a filter bandwidth is set such that the frequency component associated with, for example, the fifth-order modulation distortion passes the low-pass filter 304. Hereinafter, similarly to the above description, for the frequency component associated with the fifth-order modulation distortion, the magnitude comparison with respect to the regulation value is also performed.

In contrast, if the result of the comparison at Step S106 indicates that the measurement value is equal to or greater than the regulation value (No at Step S106), this indicates that the level of the frequency component associated with, for example, the third-order modulation distortion is equal to or greater than the regulation value and indicates that the regulation is not satisfied. Accordingly, this comparison result is notified from the comparing unit 205 to the transmission level control unit 206 and the upper limit of the transmission level that is used to satisfy the regulation is calculated by the transmission level control unit 206 on the basis of the difference between the regulation value and the measurement value (Step S108). Namely, transmission level is calculated as the upper limit of the transmission level such that the difference between the regulation value and the measurement value obtained by the measuring unit 306 becomes zero.

At this point, if electrical power of a transmission signal input to the power amplifier 180 becomes small due to a decrease in the transmission level, generation of inter modulation distortion is suppressed and the level of the frequency component obtained by the measurement performed by the measuring unit 306 is also decreased. Accordingly, if electrical power of a transmission signal is controlled such that the electrical power does not exceed the upper limit of the transmission level calculated by the transmission level control unit 206, the level of the frequency components that are included in the transmission signal and that are associated with, for example, the third-order modulation distortion becomes less than the regulation value and thus the regulation related to the inter modulation distortion is satisfied.

However, because the transmission electrical power of the wireless communication apparatus 100 is also specified by the transmission electrical power control by, for example, a base station device, the transmission level control unit 206 is not allowed to decrease the upper limit of the transmission level without limitation. Accordingly, the transmission level control unit 206 determines whether the upper limit of the calculated transmission level is present within the allowable range of the transmission electrical power control (Step S109). If the result of this determination indicates that the upper limit of the transmission level is present within the allowable range (Yes at Step S109), the calculated value is set as the upper limit of the transmission level in the transmission level control unit 206 (Step S110). Consequently, in the control of the subsequent transmission levels, the electrical power of the transmission signal is controlled such that the electrical power does not exceed the set upper limit. Then, under this control, the level of the frequency component associated with the third-order modulation distortion is measured again (Step S105) and the measurement value is compared with the regulation value (Step S106). In this case, after the control of the transmission level performed by the transmission level control unit 206, the measurement value becomes less than the regulation value and thus the process at Step S107 described above and the subsequent processes are to be performed.

In contrast, if the result of the determination at Step S109 indicates that the upper limit of the transmission level exceeds the allowable range (No at Step S109), a limit value within the allowable range is set as the upper limit of the transmission level in the transmission level control unit 206 (Step S111). Namely, even if the upper limit of the transmission level is decreased, because the upper limit is not allowed to be decreased below the lower limit of the transmission electrical power specified by the transmission electrical power control, a limit allowed by the transmission electrical power control is set to the upper limit of the transmission level by the transmission level control unit 206.

In this case, even if the electrical power of the transmission signal is controlled such that the electrical power does not exceed the upper limit of the set transmission level, continuously, the measurement value acquired by the measuring unit 306 may possibly be equal to or greater than the regulation value. Accordingly, the transmission level control unit 206 notifies the voltage control unit 207 that the inter modulation distortion is not sufficiently suppressed if the electrical power of the transmission signal is simply decreased.

In response to the notification from the transmission level control unit 206, the voltage control unit 207 outputs, to the power supply management unit 120, an instruction to increase the voltage applied to the power amplifier 180 (Step S112). Namely, because the inter modulation distortion is not sufficiently suppressed if the transmission level is simply decreased, an instruction to increase the voltage applied to the power amplifier 180 is output in order to further suppress the inter modulation distortion. At this time, an instruction is output so as to increase the voltage applied to the power amplifier 180 by, for example, a predetermined step width. Then, under the control of such a transmission level and a voltage, the level of the frequency component associated with the third-order modulation distortion is measured again (Step S105) and the measurement value is compared with the regulation value (Step S106).

At this point, due to the transmission level control performed by the transmission level control unit 206 and an increase in the voltage applied to the power amplifier 180, there may be a case in which the measurement value becomes less than the regulation value or there may be a case in which the measurement value still remains equal to or greater than the regulation value. If the measurement value becomes less than the regulation value, the process at Step S107 described above and the subsequent processes are performed. In contrast, if the measurement value still remains equal to or greater than the regulation value, the voltage control unit 207 instructs the power supply management unit 120 to again increase the voltage applied to the power amplifier 180 by the predetermined step width. In this way, until the measurement value becomes less than the regulation value, while the upper limit of the transmission level is decreased to the limit value allowed by the transmission electrical power control, the voltage applied to the power amplifier 180 is increased by the predetermined step width. Consequently, the inter modulation distortion generated in the transmission signals in the power amplifier 180 is sufficiently suppressed and thus it is possible to satisfy the regulation related to the inter modulation distortion.

FIG. 7 is a schematic diagram illustrating a case in which the inter modulation distortion is suppressed by the distortion suppressing process according to the first embodiment. The upper portion, the middle portion, and the lower portion of FIG. 7 indicates specific example of the input/output characteristics of the power amplifier 180. Namely, as illustrated in the upper portion of FIG. 7, an input/output characteristic 411 related to the CC indicates that linear amplification is performed in the area in which input electrical power is relatively small and indicates that nonlinear amplification is performed if input electrical power becomes large. Furthermore, an input/output characteristic 412 related to the inter modulation distortion has an inclination greater than that of the input/output characteristic 411 related to the CC and, if, for example, for the third-order modulation distortion, the inclination thereof is three times as large as the input/output characteristic 411 related to the CC. Then, an intersection point 413 of the line extended from the segment of the linear area of the input/output characteristic 411 related to the CC and the input/output characteristic 412 related to the inter modulation distortion is called an intercept point and is used as the index of the inter modulation distortion generated in the power amplifier 180.

In the embodiment, if the level of the inter modulation distortion is equal to or greater than the regulation value, the upper limit of the transmission level is decreased by the transmission level control unit 206. If the upper limit of the transmission level is decreased, the electrical power of the transmission signal input to the power amplifier 180 is decreased. Furthermore, as illustrated in the middle portion of FIG. 7, the electrical power of the inter modulation distortion generated when input electrical power P1 is D1; however, if electrical power input to the power amplifier 180 is decreased and reaches electrical power P2, inter modulation distortion is not generated. In this way, by decreasing the transmission level by the transmission level control unit 206, the inter modulation distortion generated in the power amplifier 180 can be suppressed.

Furthermore, in the embodiment, if inter modulation distortion is not sufficiently suppressed even if the transmission level is decreased to the allowable limit, an instruction is output by the voltage control unit 207 to increase the voltage applied to the power amplifier 180. If the voltage applied to the power amplifier 180 is increased, the generated inter modulation distortion becomes small. Namely, as illustrated in the lower portion of FIG. 7, when the electrical power of the inter modulation distortion generated with respect to the input electrical power P1 is D1, if the voltage applied to the power amplifier 180 is increased, the input/output characteristic related to the inter modulation distortion becomes from a straight line 412 to a straight line 412*a*. Furthermore, accordingly, the intercept point becomes from a point 413 to a point 413*a*. Consequently, after the applied voltage is increased, the electrical power of the inter modulation distortion generated with respect to the input electrical power P1 is decreased to D2. In this way, by increasing the voltage applied to the power amplifier 180, the inter modulation distortion generated in the power amplifier 180 can be suppressed.

As described above, according to the first embodiment, the wireless communication apparatus extracts inter modulation distortion from a feedback signal on the basis of frequency information related to a plurality of CCs and decreases, if the level of the inter modulation distortion is equal to or greater than the regulation value, the electrical power of the transmission signal within the allowable range. Furthermore, if the level of the inter modulation distortion is not sufficiently decreased even if the electrical power of the transmission signal is decreased within the allowable range, the voltage applied to the power amplifier is increased. Consequently, even if a signal of a plurality of component carriers is amplified by a common power amplifier, inter modulation distortion can be suppressed.

Furthermore, in the first embodiment, the regulation value is set by the absolute value of the level, the regulation value is sometimes set by relative comparison between the level of a signal of a CC and the level of inter modulation distortion. In such a case, the local signal setting unit 202 in the modem 171 notifies the local signal generating unit 302 in the detecting unit 174 of the local frequency that is used to extract a CC component from a feedback signal and the measuring unit 306 measures the level of the CC component. Because the level of the CC component is measured, it is possible to obtain the relative comparison between the level of the CC component and the level of each of the frequency components of the inter modulation distortion.

[b] Second Embodiment

The characteristic of a second embodiment is that the condition of the frequencies of CCs in each of which the regulation related to inter modulation distortion is strict is previously stored and, if a frequency of a CC of a transmission signal matches the stored condition, the inter modulation distortion is suppressed such that the regulation is satisfied.

The configuration of a wireless communication apparatus according to the second embodiment is the same as that in the first embodiment (FIGS. 1, 2, and 5); therefore, descriptions thereof will be omitted. In the second embodiment, the function of the modem 171 differs from that in the first embodiment.

Figure 8:
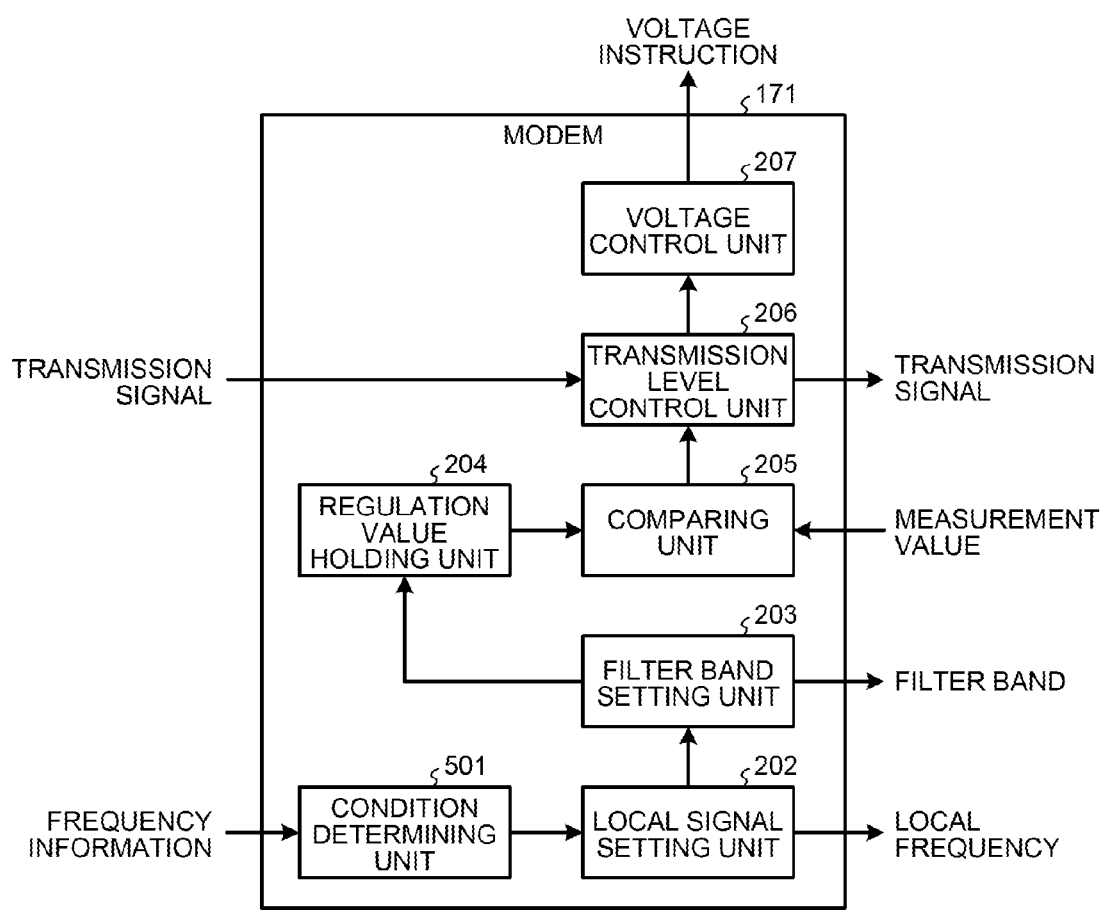
FIG. 8 is a block diagram illustrating the function of a modem according to a second embodiment.

FIG. 8 is a block diagram illustrating the function of the modem 171 according to a second embodiment. In FIG. 8, components that are the same as those illustrated in FIG. 3 are assigned the same reference numerals and descriptions thereof will be omitted. As illustrated in FIG. 8, the modem 171 according to the second embodiment includes a condition determining unit 501, instead of the IM frequency calculating unit 201 in the modem 171 (FIG. 3) according to the first embodiment.

The condition determining unit 501 stores therein, in advance, the condition of the frequencies of CCs in each of which the regulation related to inter modulation distortion is strict. Namely, the condition determining unit 501 stores therein combinations of frequencies of CCs that generate inter modulation distortion belonging to, for example, a frequency band with the minimum regulation value of the level of inter modulation distortion. If the condition determining unit 501 receives, from the processor 160, the frequency information related to the frequencies of a plurality of CCs in which transmission signals are superimposed, the condition determining unit 501 determines whether the frequencies of these CCs match the stored condition.

If the frequencies of the plurality of CCs in which transmission signals are superimposed match the previously stored condition, the condition determining unit 501 notifies the local signal setting unit 202 of the frequencies of inter modulation distortion generated due to these combinations of CCs. Accordingly, the local signal setting unit 202 notifies the local signal generating unit 302 in the detecting unit 174 of the local frequency that is associated with the frequencies of the inter modulation distortion notified from the condition determining unit 501.

Furthermore, the condition determining unit 501 may also perform determination not only about the condition related to a frequency of a CC but also about the condition related to the channel bandwidth and the resource block that are used to transmit a transmission signal or about the condition related to the transmission level. Namely, the condition determining unit 501 stores therein various kinds of transmission conditions in each of which the regulation related to the inter modulation distortion is strict and may determine whether the transmission condition of a transmission signal that is actually transmitted matches one of the stored transmission conditions. At this time, the condition determining unit 501 acquires, from the processor 160, the transmission condition of the transmission signal that is actually transmitted. Furthermore, the condition determining unit 501 stores therein not only the most strict transmission condition but also a plurality of transmission conditions and may notify, if one of the transmission conditions is satisfied, the local signal setting unit 202 of the frequency of the inter modulation distortion associated with the transmission condition.

Figure 9:
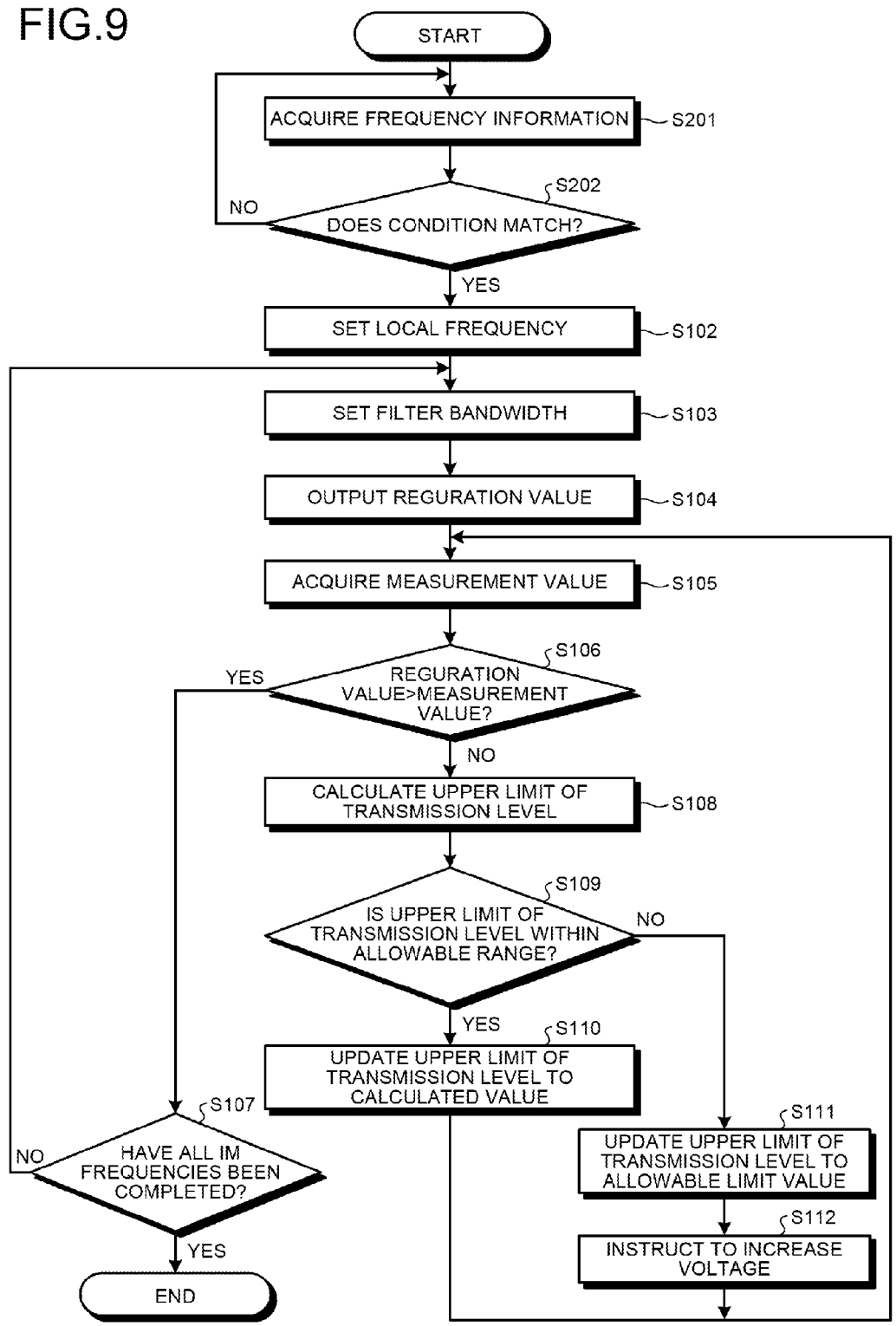
FIG. 9 is a flowchart illustrating a distortion suppressing process according to the second embodiment.

In the following, the distortion suppressing process performed by the wireless communication apparatus 100 having the configuration described above will be described with reference to the flowchart illustrated in FIG. 9. In FIG. 9, components that are the same as those illustrated in FIG. 6 are assigned the same reference numerals and descriptions thereof will be omitted.

If frequency information about a plurality of CCs in which transmission signals are superimposed is input from the processor 160 to the condition determining unit 501 (Step S201), the condition determining unit 501 determines whether the frequencies of the plurality of CCs match the conditions stored in advance (Step S202). Namely, the condition determining unit 501 determines whether the frequencies of the CCs that are used to transmit a transmission signal generate inter modulation distortion within the frequency band in which the regulation is strict.

If the result of determination indicates that the frequencies of the plurality of the CCs that are used for the transmission do not match the conditions (No at Step S202), the condition determining unit 501 acquires frequency information related to the subsequent transmission signal without performing the distortion suppressing process. In this way, if the frequencies of the plurality of CCs that are used for transmission do not match the condition, the distortion suppressing process is not performed. Consequently, electrical power consumed in, for example, the measuring unit 306 or the comparing unit 205 can be reduced.

In contrast, if he frequencies of the plurality of the CCs that are used for the transmission match the conditions (Yes at Step S202), the frequencies of the inter modulation distortion generated from these CCs are notified to the local signal setting unit 202. Then, similarly to the first embodiment, the distortion suppressing process is performed. In the second embodiment, if the frequencies of a plurality of CCs that are used for transmission generate inter modulation distortion within the frequency band in which the regulation is strict, the distortion suppressing process is performed, whereby the strict regulation is satisfied. Consequently, for the combinations of CCs that generate inter modulation distortion in the frequency band in which the regulation is further loose, the regulation is of course satisfied.

If the frequency of the inter modulation distortion is notified to the local signal setting unit 202, the local signal setting unit 202 sets the local frequency in the detecting unit 174 (Step S102). Namely, the local signal setting unit 202 removes CC components from the signal amplified by the power amplifier 180 and notifies the local signal generating unit 302 in the detecting unit 174 of the local frequency that is used to extract inter modulation distortion.

Then, a local signal with the notified local frequency is generated by the local signal generating unit 302 and a feedback signal that is fed back from the coupler 190 is subjected to the quadrature demodulation by the quadrature demodulating unit 303. At the same time, the filter band setting unit 203 sets a filter bandwidth such that a specific frequency component of the inter modulation distortion passes the low-pass filter 304 (Step S103).

If the filter bandwidth of the low-pass filter 304 is set by the filter band setting unit 203, the regulation value associated with the set filter bandwidth is output from the regulation value holding unit 204 to the comparing unit 205 (Step S104). Then, the measuring unit 306 in the detecting unit 174 measures the level of the frequency component that passes the low-pass filter 304 (Step S105).

Then, the comparing unit 205 performs magnitude comparison between the regulation value and the measurement value of the level of the frequency component (Step S106). If the result of comparison indicates that the measurement value is less than the regulation value (Yes at Step S106), this indicates that the regulation is satisfied. Accordingly, the filter band setting unit 203 determines whether, for all of the frequency components included in the inter modulation distortion extracted from the feedback signal, the comparison with the regulation value has been completed (Step S107). If the result of this determination indicates that comparison with all of the frequency components has been completed (Yes at Step S107), the distortion suppressing process has been completed. In contrast, there are some frequency components that have not been subjected to the comparison (No at Step S107), the filter bandwidth of the low-pass filter 304 is set so as to pass any one of the frequency components (Step S103). Similarly to the case described above, the magnitude comparison with the regulation value is performed for the frequency components that newly pass the low-pass filter 304.

In contrast, if the result of comparison performed at Step S106 indicates that the measurement value is equal to or greater than the regulation value (No at Step S106), this indicates that the regulation is not satisfied. Accordingly, this comparison result is notified from the comparing unit 205 to the transmission level control unit 206 and the upper limit of the transmission level for satisfying the regulation is calculated by the transmission level control unit 206 on the basis of the difference between the regulation value and the measurement value (Step S108). Furthermore, the transmission level control unit 206 determines whether the upper limit of the calculated transmission level is present within the allowable range of the transmission electrical power control (Step S109). If the result of determination indicates that the upper limit of the transmission level is within the allowable range (Yes at Step S109), the calculated value is set as the upper limit of the transmission level in the transmission level control unit 206 (Step S110). Consequently, in the control of the subsequent transmission level, electrical power of a transmission signal is controlled so as not to exceed the set upper limit.

In contrast, if the result of the determination at Step S109 indicates that the upper limit of the transmission level exceeds the allowable range (No at Step S109), a limit value within the allowable range is set as the upper limit of the transmission level in the transmission level control unit 206 (Step S111). Then, the transmission level control unit 206 notifies the voltage control unit 207 that the inter modulation distortion is not sufficiently suppressed if the electrical power of transmission signal is simply decreased.

In response to the notification from the transmission level control unit 206, the voltage control unit 207 sends, to the power supply management unit 120, an instruction to increase the voltage applied to the power amplifier 180 (Step S112). At this time, the power supply management unit 120 is instructed to increase the voltage applied to the power amplifier 180 by, for example, the predetermined step width.

As described above, according to the second embodiment, the wireless communication apparatus determines whether CCs that are actually used for transmission match the transmission conditions of generating inter modulation distortion within the frequency band in which regulation is strict. If the CCs match the transmission conditions, the wireless communication apparatus performs the distortion suppressing process, whereas, if the CCs do not match the transmission conditions, the wireless communication apparatus skips the distortion suppressing process. Consequently, if CCs that generate inter modulation distortion within the frequency band in which regulation is strict is transmitted while the most strict regulation related to the inter modulation distortion is satisfied, it is possible to reduce electrical power consumed in the distortion suppressing process.

[c] Third Embodiment

The characteristic of a third embodiment is that a signal is transmitted by adjusting the transmission level by using a test signal during a test mode in which no signal is transmitted from an antenna and by setting the adjusted transmission level during an operation mode in which the signal is transmitted from the antenna.

The overall configuration of a wireless communication apparatus according to the third embodiment is the same as that in the first embodiment (FIG. 1); therefore, descriptions thereof will be omitted. In the third embodiment, the configuration of the transmitting unit and the function of the modem 171 differ from those in the first embodiment.

Figure 10:
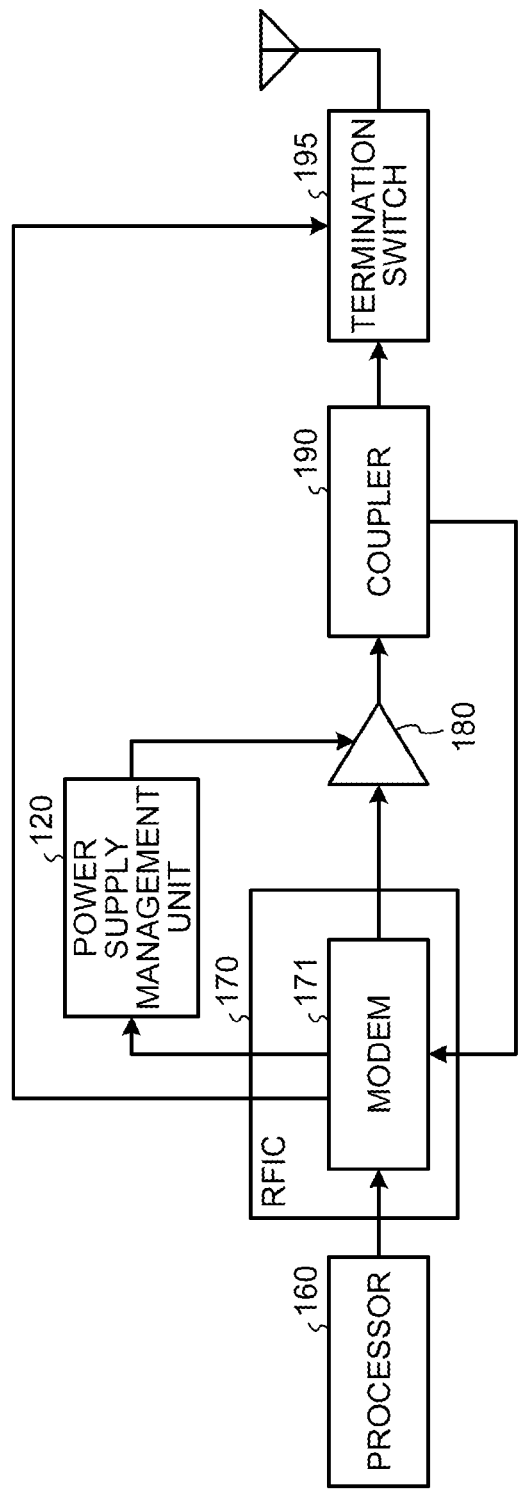
FIG. 10 is a block diagram illustrating the configuration of a transmitting unit according to a third embodiment.

FIG. 10 is a block diagram illustrating the configuration of a transmitting unit according to a third embodiment. In FIG. 10, components that are the same as those illustrated in FIG. 2 are assigned the same reference numerals and descriptions thereof will be omitted. Furthermore, in FIG. 10, the configuration related to data reception and the configuration of the RFIC 170 in detail are omitted. As illustrated in FIG. 10, the power amplifier 180, the coupler 190, and a termination switch 195 are provided between the RFIC 170 and the antenna.

The termination switch 195 allows, in accordance with a change in modes by the modem 171, the signal output from the coupler 190 to terminate during the test mode and does not output the signal to the antenna. Furthermore, the termination switch 195 outputs the signal output from the coupler 190 to the antenna during the operation mode and transmits the signal from the antenna.

Figure 11:
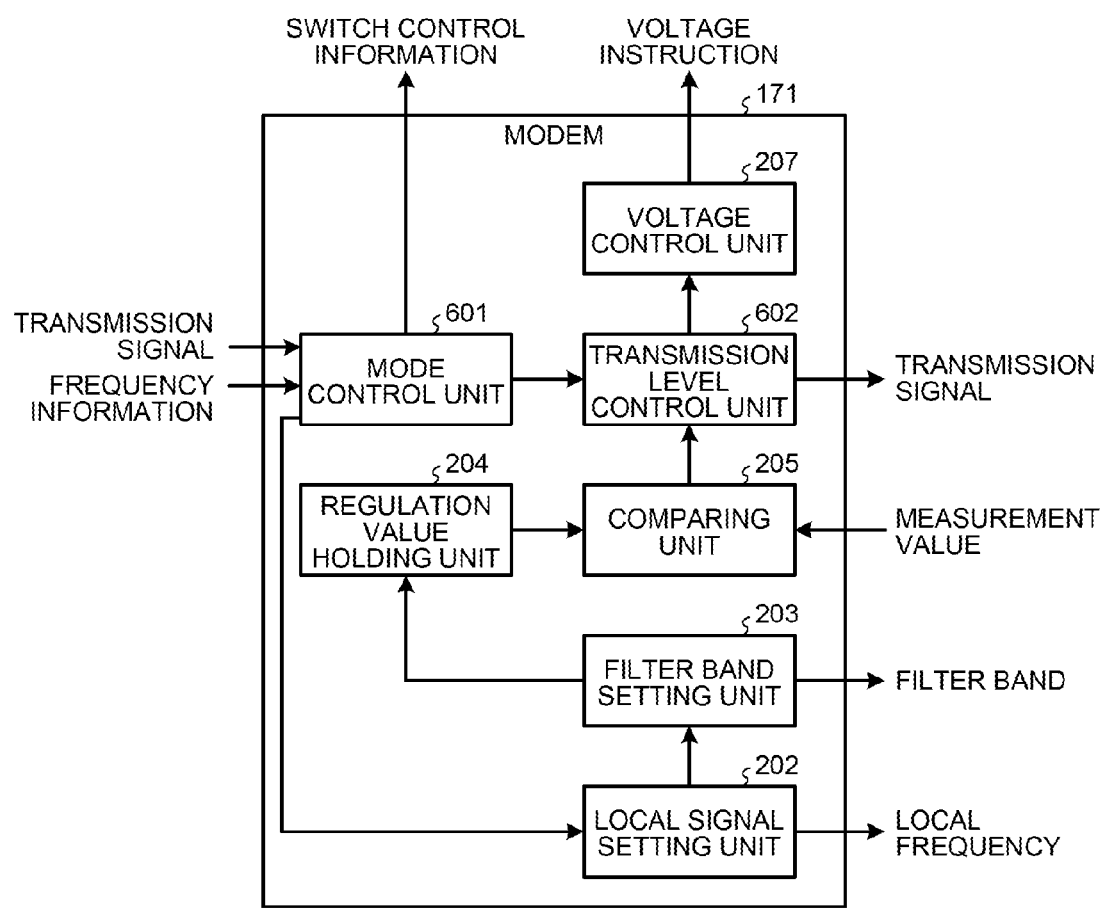
FIG. 11 is a block diagram illustrating the function of a modem according to the third embodiment.

FIG. 11 is a block diagram illustrating the function of the modem 171 according to the third embodiment. In FIG. 11, components that are the same as those illustrated in FIG. 3 are assigned the same reference numerals and descriptions thereof will be omitted. As illustrated in FIG. 11, the modem 171 according to the third embodiment includes, instead of the IM frequency calculating unit 201 and the transmission level control unit 206 in the modem 171 (FIG. 3) according to the first embodiment, a mode control unit 601 and a transmission level control unit 602.

The mode control unit 601 changes each of the units in the modem 171 and the detecting unit 174 to the test mode at a predetermined timing in which no transmission signal is input from the processor 160, such as a startup of the wireless communication apparatus 100; generates a test signal; and allows the distortion suppressing process to be performed. Namely, the mode control unit 601 generates a test signal during the test mode; outputs the test signal to the transmission level control unit 602; and notifies the local signal setting unit 202 of, by using the test signal, the frequency of the inter modulation distortion generated in the power amplifier 180. Furthermore, when the mode control unit 601 changes modes to the test mode, the mode control unit 601 notifies the termination switch 195 of switch control information and performs control such that the signal output from the coupler 190 is terminated.

Furthermore, in the operation mode in which a transmission signal is input from the processor 160, the mode control unit 601 stops the functions that are performed by the measuring unit 306, the comparing unit 205, or the like and that are used for the distortion suppressing process. Then, the mode control unit 601 acquires the frequency information on transmission signals during the operation mode and notifies the transmission level control unit 602 of the frequencies of a plurality of CCs in which the transmission signals are superimposed. Furthermore, the mode control unit 601 notifies the termination switch 195 of switch control information when the mode control unit 601 changes modes to the operation mode and performs control such that the signals output from the coupler 190 are output from the antenna.

If the mode control unit 601 changes modes to the test mode, the transmission level control unit 602 controls the electrical power of the test signal generated by the mode control unit 601. Then, if the result of comparison performed by the comparing unit 205 indicates that the level of the inter modulation distortion generated in the test signal in the power amplifier 180 does not satisfy the regulation, the transmission level control unit 602 calculates the upper limit of the transmission level that satisfies the regulation. Furthermore, similarly to the first embodiment, the transmission level control unit 602 sets the upper limit of the transmission level within the range allowed by the transmission electrical power control and controls the electrical power of the transmission signals. Accordingly, if the upper limit of the transmission level that satisfies the regulation exceeds the range allowed by the transmission electrical power control, the transmission level control unit 602 sets the limit value allowed by the transmission electrical power control as the upper limit of the transmission level. Then, the transmission level control unit 602 stores therein, in an associated manner, the upper limits of the set transmission levels and the frequencies of the plurality of CCs in which test signals are superimposed.

Furthermore, if the mode control unit 601 changes modes to the operation mode, the transmission level control unit 602 sets the upper limit of the transmission levels stored by being associated with the frequencies of the plurality of CCs in which test signals are superimposed.

Figure 12:
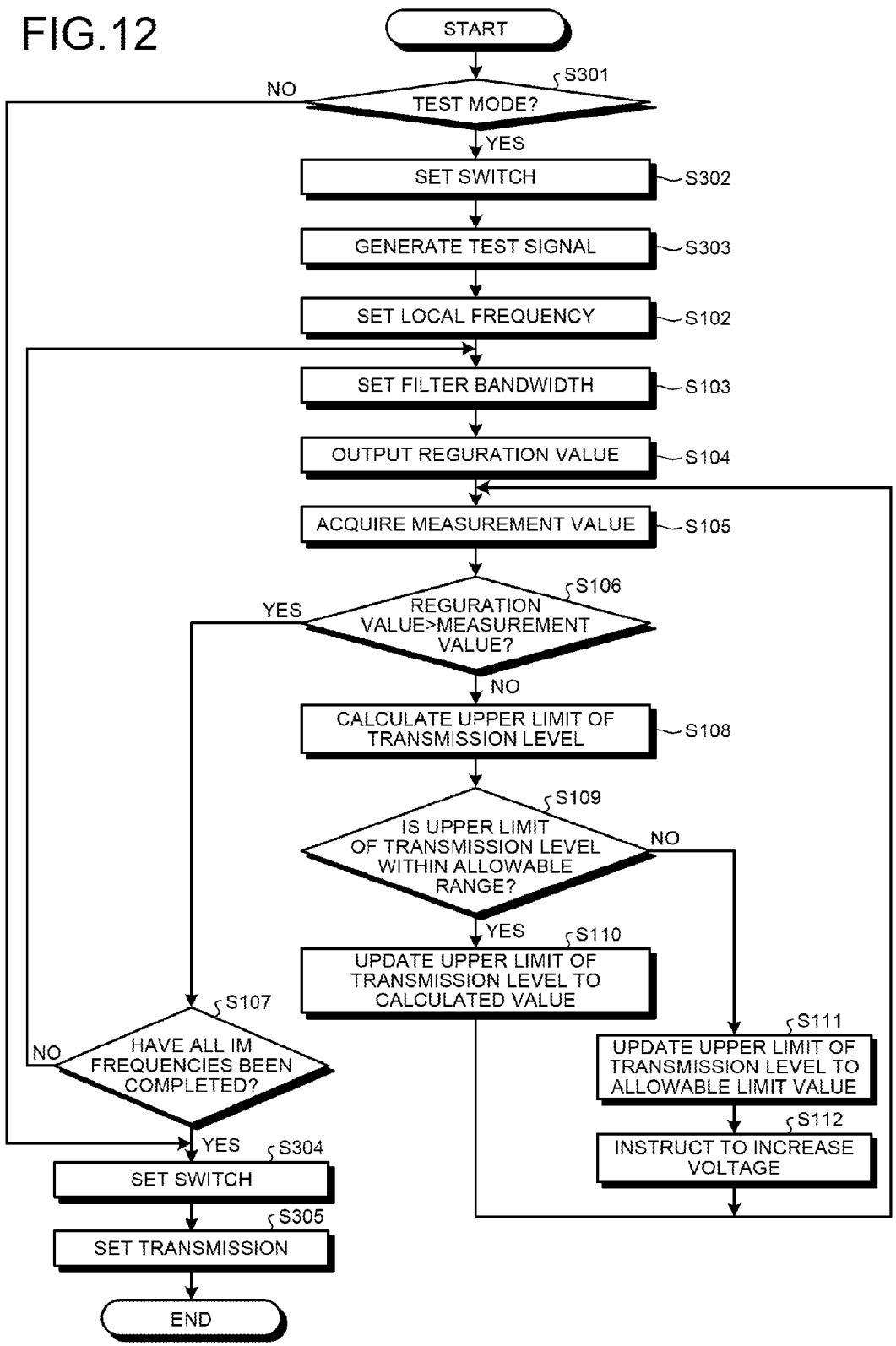
FIG. 12 is a flowchart illustrating a distortion suppressing process according to the third embodiment.
Figure 13:
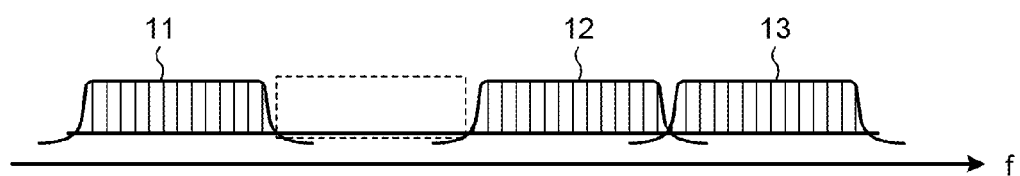
FIG. 13 is a schematic diagram illustrating a specific example of component carriers.
Figure 14:
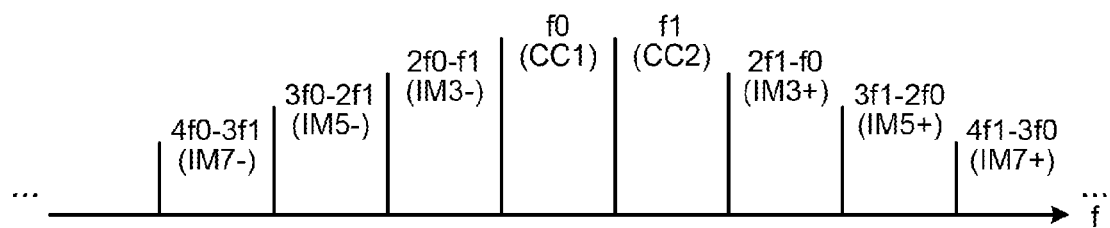
FIG. 14 is a schematic diagram illustrating frequencies in which inter modulation distortion is generated.

In the following, the distortion suppressing process performed in the wireless communication apparatus 100 having the configuration described above will be described with reference to the flowchart illustrated in FIG. 12. In FIG. 12, components that are the same as those illustrated in FIG. 6 are assigned the same reference numerals and descriptions thereof will be omitted.

First, the mode control unit 601 determines whether the test mode is being operated (Step S301). Whether or not the test mode is being operated may also be notified from the processor 160 or may also be independently determined by the mode control unit 601 when the wireless communication apparatus 100 is started up or when no transmission signal is input. If the result of determination whether the test mode is being operated indicates that the mode is not in the test mode but in the operation mode (No at Step S301), the mode control unit 601 outputs the switch control information to the termination switch 195 and performs the setting such that the signals output from the coupler 190 are to be transmitted from the antenna (Step S304).

Furthermore, during the operation mode, on the basis of the frequency information related to the transmission signals, the mode control unit 601 notifies the transmission level control unit 602 of the frequencies of the plurality of CCs in which the transmission signals are superimposed. Then, from among the upper limits of the transmission levels stored by the transmission level control unit 602 during the test mode, the transmission level control unit 602 sets the upper limits of the transmission levels stored by being associated with the frequencies of the plurality of CCs notified from the mode control unit 601 (Step S305). Consequently, control is performed by the transmission level control unit 602 such that the electrical power of the transmission signals does not exceeds the upper limit of the transmission level. Here, the upper limits of the transmission levels stored by being associated with the frequencies of the plurality of CCs during the test mode are the upper limits that are determined, in the distortion suppressing process performed on the test signals, to satisfy the regulation related to the inter modulation distortion. Accordingly, during the operation mode, by setting the upper limits of the transmission levels stored by being associated with the frequencies of the plurality of CCs that are actually transmitted, the transmission signals that satisfies the regulation related to the inter modulation distortion can be transmitted from the antenna.

In contrast, if the determination result at Step S301 indicates that the test mode is being operated (Yes Step S301), the mode control unit 601 outputs the switch control information to the termination switch 195 and performs the setting such that the signal output from the coupler 190 is terminated without being output to the antenna (Step S302). Then, a test signal is generated by the mode control unit 601 (Step S303) and is output to the transmission level control unit 602. The frequency of the test signal generated here is associated with the frequency of a CC in which, for example, the regulation related to inter modulation distortion is strict. Namely, test signals associated with a plurality of CCs that generate inter modulation distortion in frequency bands, in which the regulation value of the inter modulation distortion level is relatively small, are generated by the mode control unit 601. Then, the frequencies of the inter modulation distortion generated due to the plurality of CCs are notified to the local signal setting unit 202.

If the frequencies of the inter modulation distortion are notified to the local signal setting unit 202, the local frequency in the detecting unit 174 is set by the local signal setting unit 202 (Step S102). Namely, the local frequency that is used to remove CC components from the test signal amplified by the power amplifier 180 and that is used to extract inter modulation distortion is notified to the local signal generating unit 302 in the detecting unit 174 by the local signal setting unit 202.

Then, a local signal with the notified local frequency is generated by the local signal generating unit 302 and a feedback signal that is fed back from the coupler 190 is subjected to quadrature demodulation by the quadrature demodulating unit 303. At the same time, the setting of a filter bandwidth is performed by the filter band setting unit 203 such that specific frequency components of inter modulation distortion pass the low-pass filter 304 (Step S103).

If a filter bandwidth of the low-pass filter 304 is set by the filter band setting unit 203, the regulation value associated with the set filter bandwidth is output from the regulation value holding unit 204 to the comparing unit 205 (Step S104). Then, the level of the frequency component that passes the low-pass filter 304 is measured by the measuring unit 306 in the detecting unit 174 (Step S105).

Then, the magnitude comparison between the regulation value and the measurement value of the level of the frequency component is performed by the comparing unit 205 (Step S106). If the result of this comparison indicates that the measurement value is less than the regulation value (Yes at Step S106), this indicates that the regulation is satisfied. Accordingly, for all of the frequency components included in the inter modulation distortion extracted from the feedback signal, the filter band setting unit 203 determines whether the comparison with the regulation value has been completed (Step S107). If the result of this determination indicates that the comparison with the regulation value has been completed for all of the frequency components (Yes at Step S107), the distortion suppressing process has been completed. If frequency components that have not yet been compared with the regulation value are present (No at Step S107), a filter bandwidth of the low-pass filter 304 is set such that any one of these frequency components is to be passed (Step S103). Hereinafter, similarly to the process described above, for a frequency component that newly passes the low-pass filter 304, the magnitude comparison with the regulation value is also performed.

In contrast, if the result of the comparison at Step S106 indicates that the measurement value is equal to or greater than the regulation value (No at Step S106), this indicates that the regulation is not satisfied. Accordingly, this comparison result is notified from the comparing unit 205 to the transmission level control unit 602 and the upper limit of the transmission level that is used to satisfy the regulation is calculated by the transmission level control unit 602 on the basis of a difference between the regulation value and the measurement value (Step S108). Furthermore, the transmission level control unit 602 determines whether the upper limit of the calculated transmission level is within the allowable range of the transmission electrical power control (Step S109). If the result of this determination indicates that the upper limit of the transmission level is within the allowable range (Yes at Step S109), the calculated value is set as the upper limit of the transmission level in the transmission level control unit 602 (Step S110). Consequently, for the control of the subsequent transmission levels, electrical power of transmission signals is controlled such that the transmission level does not exceed the set upper limit.

In contrast, if the result of the determination at Step S109 indicates that the upper limit of the transmission level exceeds the allowable range (No at Step S109), a limit value within the allowable range is set as the upper limit of the transmission level in the transmission level control unit 602 (Step S111). Then, a notification is sent to the voltage control unit 207 indicating that the inter modulation distortion is not sufficiently suppressed by the transmission level control unit 602 by simply decreasing the electrical power of transmission signals.

In response to the notification from the transmission level control unit 602, the voltage control unit 207 sends, to the power supply management unit 120, an instruction to increase the voltage applied to the power amplifier 180 (Step S112). At this time, the power supply management unit 120 is instructed to increase the voltage applied to the power amplifier 180 by, for example, the predetermined step width.

Furthermore, in the third embodiment, if the regulation related to inter modulation distortion is satisfied by the distortion suppressing process that is performed on the test signal, the frequencies of the plurality of CCs associated with the test signal at that time and the upper limit of the transmission levels are stored by the transmission level control unit 602. Then, during the operation mode, the upper limit of the transmission levels that are stored by being associated with the frequencies of the plurality of CCs in which the actual transmission signals are superimposed is set by the transmission level control unit 602.

As described above, according to the third embodiment, the wireless communication apparatus generates, during the test mode in which no signal is transmitted from the antenna, a test signal in which the regulation is strict; performs the distortion suppressing process; associates the frequencies of a plurality of CCs that are associated with the test signal with the upper limits of the transmission levels. Then, the wireless communication apparatus controls, during the operation mode in which a signal is transmitted from the antenna, transmission electrical power by setting the upper limit of the transmission levels stored by being associated with the frequencies of CCs that are used for the actual transmission. Consequently, the distortion suppressing process is not needed during the operation mode and thus electrical power consumed due to the distortion suppressing process can be reduced. Furthermore, during the operation mode, it is possible to avoid the signal that includes the inter modulation distortion with the level of the regulation value or more from being transmitted from the antenna.

Furthermore, the distortion suppressing process performed by the wireless communication apparatus 100 described in each of the above embodiments may also be performed as a program that can be executed by a computer. In such a case, the communication control program may also be stored in a computer readable recording medium and then installed in the computer. Examples of the computer readable recording medium includes a portable recording medium, such as a CD-ROM, a DVD disk, a USB memory, and the like or a semiconductor memory, such as a flash memory and the like.

According to an aspect of an embodiment of the wireless communication apparatus, the communication control method, and the communication control program disclosed in the present invention, an advantage is provided in that, even if signals of a plurality of component carriers are amplified by a common power amplifier, inter modulation distortion can be suppressed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication apparatus comprising:
   an amplifying unit that amplifies an input signal that includes signals with different frequencies of a first frequency and a second frequency;
   a measuring unit that measures a level of inter modulation distortion generated in a signal obtained by the input signal being amplified by the amplifying unit;
   a calculating unit that acquires information on the first frequency and the second frequency and that calculates, on the basis of the acquired information, a frequency in which the inter modulation distortion is generated;
   a determining unit that determines whether the level of the inter modulation distortion measured by the measuring unit is equal to or greater than a regulation value that is previously stored; and
   a control unit that decreases, when a determination result obtained by the determining unit indicates that the level of the inter modulation distortion is equal to or greater than the regulation value, a level of a signal input to the amplifying unit, wherein
   the measuring unit measures the level of the inter modulation distortion in the frequency, which is calculated by the calculating unit, of the signal obtained by the input signal being amplified by the amplifying unit.

2. The wireless communication apparatus according to claim 1, wherein
   the measuring unit measures, for each frequency component in which the first frequency or the second frequency contributes with different contributions, the level of the inter modulation distortion generated in the amplifying unit, and
   the control unit decreases the level of the signal with one of the first frequency and the second frequency whose contribution to a frequency component with a level equal to or greater than the regulation value is higher.

3. The wireless communication apparatus according to claim 2, wherein
   the measuring unit measures a level for each frequency component in a difference frequency between integer multiples of the first frequency and the second frequency, and
   the control unit decreases the level of the signal with one of the first frequency and the second frequency having a greater integer that is multiplied to obtain the difference frequency in which a frequency component with a level equal to or greater than the regulation value appears.

4. The wireless communication apparatus according to claim 1, further comprising a voltage control unit that controls voltage applied to the amplifying unit, wherein
   the voltage control unit increases the voltage applied to the amplifying unit when the level of the inter modulation distortion is equal to or greater than the regulation value after the level of the signal is decreased within an allowable range.

5. The wireless communication apparatus according to claim 4, wherein, when a result of determination performed by the determining unit indicates that the level of the inter modulation distortion is less than the regulation value, the voltage control unit decreases the voltage applied to the amplifying unit.

6. The wireless communication apparatus according to claim 1, further comprising a condition determining unit that acquires information on the first frequency and the second frequency and that determines whether the first frequency and the second frequency satisfy a predetermined condition, wherein
   when a result of determination performed by the condition determining unit indicates that the first frequency and the second frequency satisfy the predetermined condition, the measuring unit measures the level of the inter modulation distortion generated in the input signal amplified by the amplifying unit.

7. The wireless communication apparatus according to claim 1, further comprising:
   a switch that switches between transmitting from an antenna and terminating the signal obtained by the input signal being amplified by the amplifying unit, and
   a mode control unit that switches modes between an operation mode in which a signal is transmitted from the antenna and a test mode in which no signal is transmitted from the antenna, that generates a test signal that includes signals of the first frequency and the second frequency to input to the amplifying unit during the test mode, and that switches the switch such that an amplified test signal is terminated, wherein
   the measuring unit measures a level of inter modulation distortion generated in the test signal in the amplifying unit, and the control unit decreases, when the level of the inter modulation distortion generated in the test signal is equal to or greater than the regulation value during the test mode, the level of the test signal that is input to the amplifying unit, stores the level of the test signal after decrease, and decreases, when a signal that includes signals with the first frequency and the second frequency is input to the amplifying unit during the operation mode, the level of the signal to the level stored during the test mode.

8. A communication control method comprising:

amplifying, by an amplifier, an input signal that includes signals with different frequencies of a first frequency and a second frequency;

measuring a level of inter modulation distortion generated in a signal obtained by the input signal being amplified;

acquiring information on the first frequency and the second frequency and calculating, on the basis of the acquired information, a frequency in which the inter modulation distortion is generated;

determining whether the level of the measured inter modulation distortion is equal to or greater than a regulation value that is previously stored; and decreasing, when a result of determination indicates that the level of the inter modulation distortion is equal to or greater than the regulation value, a level of a signal input to the amplifier, wherein the measuring includes measuring the level of the inter modulation distortion in the frequency, which is calculated at the calculating, of the signal obtained by the input signal being amplified by the amplifier.

9. A non-transitory computer-readable recording medium having stored therein a communication control program that causes a computer to execute a process comprising:

measuring a level of inter modulation distortion generated in a signal obtained by an input signal that includes signals with different frequencies of a first frequency and a second frequency being amplified by an amplifier;

acquiring information on the first frequency and the second frequency and calculating, on the basis of the acquired information, a frequency in which the inter modulation distortion is generated;

determining whether the level of the measured inter modulation distortion is equal to or greater than a regulation value that is previously stored; and decreasing, when a result of determination indicates that the level of the inter modulation distortion is equal to or greater than the regulation value, a level of a signal input to the amplifier, wherein the measuring includes measuring the level of the inter modulation distortion in the frequency, which is calculated at the calculating, of the signal obtained by the input signal being amplified by the amplifier.

* * * * *